United States Patent [19]

Christoe et al.

[11] 4,164,700
[45] Aug. 14, 1979

[54] HIGH PRESSURE APPARATUS FOR MICROWAVE RESONANCE SPECTROSCOPY

[75] Inventors: Charles W. Christoe, Flanders; Frank J. Owens, Little Falls, both of N.J.

[73] Assignee: The United States of America as represented by the Secretary of the Army, Washington, D.C.

[21] Appl. No.: 903,630

[22] Filed: May 8, 1978

[51] Int. Cl.² ............................................. G01R 33/08
[52] U.S. Cl. ............................. 324/0.5 AH; 324/0.5 A
[58] Field of Search .......... 324/0.5 R, 0.5 A, 0.5 AH, 324/0.5 AC, 58.5 C, 58 C

[56] References Cited

U.S. PATENT DOCUMENTS

| | | | |
|---|---|---|---|
| 3,348,135 | 10/1967 | Howgate | 324/0.5 R |
| 3,691,454 | 9/1972 | Hrubesh | 324/0.5 R |
| 3,805,148 | 4/1974 | Uehara | 324/0.5 R |

*Primary Examiner*—M. Tokar
*Attorney, Agent, or Firm*—Nathan Edelberg; Harold H. Card, Jr.; A. Victor Erkkila

[57] ABSTRACT

The apparatus comprises the combination of a microwave cavity or resonator having a side opening through which a separate high pressure sample container extends. The container comprises a dielectric nylon or Delrin tube, closed at one end and open at the other, with the closed end located within the cavity, having an outer diameter at least five times its inner diameter and capable of withstanding internal sample pressures of at least 2000 atmospheres. The open end of the dielectric tube is connected to a high pressure source by two high pressure seals.

6 Claims, 3 Drawing Figures

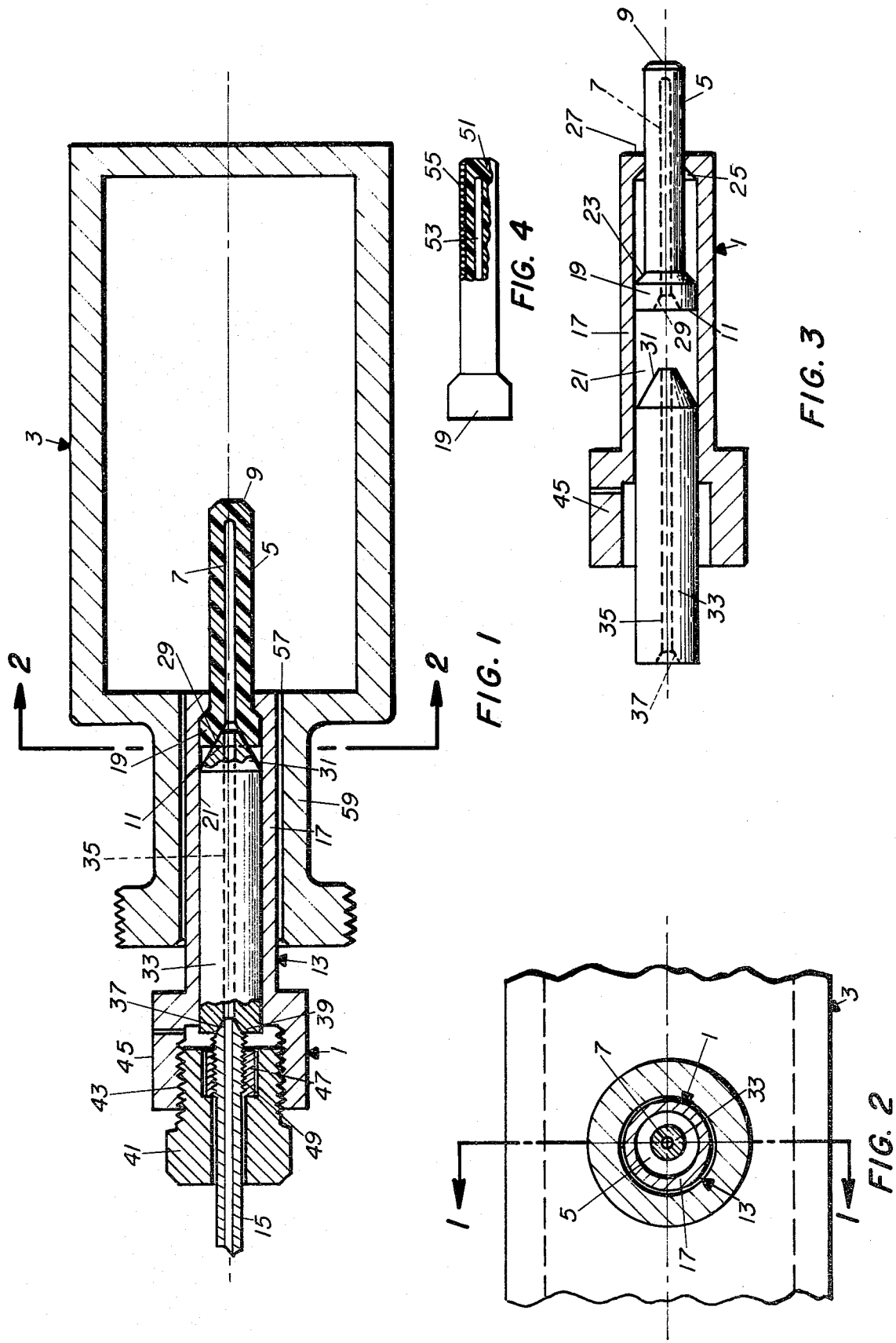

HIGH PRESSURE APPARATUS FOR MICROWAVE RESONANCE SPECTROSCOPY

GOVERNMENTAL INTEREST

The invention described herein may be manufactured, used and licensed by or for the Government for governmental purposes without payment to us of any royalty thereon.

BACKGROUND AND SUMMARY OF THE INVENTION

One of the problems involved in microwave spectroscopy is that of containing a sample material, having pressure-dependent spectral lines, within a microwave cavity field at hydrostatic pressures of several thousand atmospheres.

Previous methods of attaining extremely high pressures inside a microwave cavity have involved making the cavity wall itself the pressure vessel or container. When this is done, the walls of the cavity have to be made of nonmagnetic, conducting materials of high tensile strength. For example, the cavity was machined from a block of beryllium-copper alloy and the hydrostatic medium filled the entire cavity. The microwaves were coupled into the cavity through the cavity walls by an antenna connected to an electrical feed-through in an insulating plug or bushing. This method had the following disadvantages:

a. The necessity of machining the microwave cavity;

b. The sensitivity of the microwave detection system was reduced because of:
  1. Microwave losses at the feed-through;
  2. Increased pole separation of the electromagnetic poles necessary to accomodate the greatly enlarged cavity; and
  3. Detuning of the cavity frequency due to pressure-induced cavity deformations; and c. Safety hazards accompanied by attainment of such high pressure in such a large volume (e.g. 30 cm$^3$) of highly compressed fluid.

An object of the present invention is to provide a separate high pressure sample container that can be inserted or positioned within the microwave field of a standard cavity resonator or waveguide. In accordance with the invention, the sample container comprises an elongated dielectric tube capable of withstanding an internal pressure of at least 2000 atmospheres, and having a dielectric constant not greater than 4, whereby it is transparent to microwaves. The outer diameter of the dielectric tube is at least five times its inner diameter, to withstand such a high pressure. The dielectric tube has an open end connected by a high pressure seal to a source of the desired pressure, and a closed end which is positioned within a microwave cavity or waveguide. A preferred dielectric material, which has been successfully used for this purpose, is nylon, with a dielectric constant of 3.5 at 10$^6$ cycles/sec. Another suitable material is Delrin, with a dielectric constant of 3.7 at 10$^6$ cycles/sec.

The ultimate tensile strength of nylon is in the range of 12-14×10$^3$ psi, which would appear to limit the use of nylon as the pressure tube material to 1-1.5×10$^3$ atmospheres. However, the ultimate tensile strength of a material is not necessarily the upper limit of its ability to contain internal pressure. Consider a hollow cylinder of inside radius a and outside radius b. The tangential stress at any radius r where $a \leq r \leq b$ is given by $$S_{tangential} = \frac{P_i}{w^2 - 1}\left(1 + \frac{b^2}{r^2}\right),$$

where $P_i$ is the internal pressure and $w = b/a$. At the inner surface ($r = a$) this reduces to $$S_t = P_i \frac{(w+1)}{(w-1)},$$

which implies that $S_t > P_i$. However, at the outer surface ($r = b$), the formula reduces to $$S_t = \frac{2 P_i}{w^2 - 1},$$

which, for a 5:1 wall ratio as chosen, implies that $S_t < 1/10\, P_i$. Accordingly, a material having a tensile strength of 10$^4$ psi could contain pressures approaching 10$^5$ psi, or 7000 atmospheres, even though the inner surface is stressed beyond its elastic limit. The normal strengths are true only for materials in the elastic state, a condition that does not exist in the high pressure dielectric tube used in the present invention. Here, however, is the beauty of a material like nylon which has an enormous elongation (e.g. 15%) at the yield point. This means that although the stresses exceed the tensile strength at the inner surface, the material remains elastic because it cannot stretch beyond its yield point—there is no place for the material to go. It is confined all around on the outside by material that is stressed to values less than the ultimate strength thereof. As usual, the theoretical limit of this idealized condition is not attainable experimentally. Pressures of 7000 atmospheres have not yet been achieved. However, tests have shown that the overstressed material near the inner surface of the dielectric sample tube does exhibit unusual mechanical strength. There is a pressure gradient in which the stress decreases as r goes from a to b. The area of a virtual concentric surface of radius r increases as r$^2$, and since the applied radial force is at most constant (if it is not reduced by the strength of the interior overstressed material) the pressure falls off at least as r$^2$, so that at some point $P_i$ gets small enough that the outer material can contain it (assuming that there is still some outer material left, i.e., $r < b$).

BRIEF DESCRIPTION OF THE DRAWING

FIG. 1 is a longitudinal section view, taken on the line 1—1 of FIG. 2 of a high pressure container and associated microwave cavity, embodying the present invention.

FIG. 2 is a transverse section view taken on line 2—2 of FIG. 1.

FIG. 3 is a longitudinal section view showing the container parts of FIG. 1 partly assembled together.

DETAILED DESCRIPTION OF THE INVENTION

FIG. 1 illustrates the present invention embodied in a high pressure container 1 partially inserted into a microwave cavity or resonator 3. The container 1 comprises an elongated dielectric tube 5, e.g. of nylon or Delrin, that is closed at one end 9 and open at the other end 11.

In order to withstand the extremely high internal pressure of several thousand atmospheres without rupture, the outer diameter of the dielectric tube 5 must be at least five times the diameter of the bore 7. For example, the dielectric tube 5 may have an inner diameter (bore 7) of 0.04 in. and an outer diameter of 0.2 in. To be sufficiently transparent to microwave field for microwave spectroscopy measurements, the tube 5 should have a dielectric constant not greater than about 4. Tests have proved that nylon, which has a dielectric constant of about 3.5 at the frequencies involved, has the necessary tensile strength to withstand the desired high pressure in the tube 5. Delrin has a dielectric constant of about 3.7 at the frequencies involved and a tensile strength of $10 \times 10^3$ psi at room temperature.

The sample material to be subjected to spectroscopic measurements in the tube 5 may be a liquid or a solid, e.g. potassium chromic sulfate $KCr(SO_4)_2 \cdot 12H_2O$.

The required high pressure within the sample tube 5 is preferably produced and maintained by connecting the open end 11 of the tube to a high pressure seal 13, which, in turn is connected, by a length of ⅝" O.D.×0.02" I.D. standard high pressure capillary steel tubing 15, to a source of high pressure (not shown). The seal 13 comprises a standard 5/16" I.D. elongated tubular steel holder 17 within which the open end 11 of tube 5 is slidable. The tube 5 has an enlarged head 19 which slides within the main bore 21 of holder 17, and has a cone rear surface 23 that sealingly engages a complementary cone surface 25 on an inner flange 27 on the holder 17 (see FIG. 3). The head 19 of tube 5 is formed with an internal cone surface 29, which merges with the bore 7, for sealingly engaging a complementary external cone surface 31 on a cylindrical steel push piece 33 slidable in the holder 17. The push piece may be cut from 5/16" O.D.×1/16" I.D. stainless steel high pressure tubing with a bore 35 forming a continuation of the bore 7. The outer end of push piece 33 has an internal cone surface 37, merging with bore 35, for sealingly engaging a complementary external cone surface 39 on the capillary steel tubing 15. The two cone seals between the push piece 33 and the tube 5 and capillary tubing 15 are maintained under compression by a gland 41 that is threaded, at 43, into an enlarged extension 45 of the tubular holder 17, and is connected to the capillary tubing 15 by a radial flange 47. Flange 47 consists of a cylinder with an axial bore which is threadedly attached, at 49, to capillary tubing 15 near the conical end thereof.

In addition to the use of solid nylon or Delrin for the sample tube 5, various reinforced plastics have been used in the fabrication of the pressure cell. The highest pressures are achievable with a cell made by reducing the outside diameter of the tube from that shown in FIG. 1, and then building it up to the necessary size with one or more windings of fiberglass coated with epoxy resin. Such a sample tube is shown in FIG. 4, wherein a vinyl base 51, having a small bore 53 closed at one end as in FIG. 1, and an external diameter smaller than that normally required, is reinforced by at least one prestressed winding 55 of fiberglass coated with epoxy resin.

The high pressure container 1 is inserted partially through an access port 57 in a conventional resonant cavity or resonator 3, with the dielectric sample tube 5 located almost entirely within the cavity and the holder 17 supported in a tubular receptacle 59. For example, the cavity 3 may be a Varian Microwave Cavity No. E4531. Spectral measurements are made by subjecting the sample placed in tube 5 to microwave radiation and at the same time varying a large dc magnetic field in which the cavity is located.

The foregoing disclosure and drawings are merely illustrative of the principles of this invention and are not to be interpreted in a limiting sense. I wish it to be understood that I do not desire to be limited to the exact details of construction shown and described, because obvious modifications will occur to a person skilled in the art.

What is claimed is:

1. Apparatus for microwave resonance spectroscopy, comprising:
   a microwave cavity resonator, adapted to be excited to establish a microwave electric field in a given direction therein, and having an access opening in one side thereof;
   an elongated dielectric tube, closed at one end and open at the other end, and having an outer diameter at least equal to five times its inner diameter, partially disposed in said cavity resonator with its closed end portion extending through said access opening transverse to said field direction; said tube being capable of withstanding a high internal fluid pressure of at least 2000 atmospheres and having a dielectric constant not greater that 4;
   a sample material, having pressure-dependent spectral lines, filling said tube; and
   high pressure means for connecting said open end of said tube to a source of said high fluid pressure, for pressurizing said sample material.

2. Apparatus as in claim 1, wherein at least the inner portion of said tube within said resonator is made of a plastic selected from the group consisting of nylon and Delrin.

3. Apparatus as in claim 1, wherein said tube comprises an inner plastic portion surrounded by at least one prestressed glass fiber winding coated with an epoxy resin.

4. Apparatus as in claim 1, wherein said sample material is $KCr(SO_4)_2 \cdot 12H_2O$.

5. Apparatus as in claim 1 wherein said connecting means comprises at least one high pressure cone seal.

6. Apparatus as in claim 1, wherein said connecting means comprises:
   an enlarged head on said open end of said tube, having an internal cone surface merging with the bore of said tube;
   an elongated tubular steel holder, slidably receiving said tube head, and having a reduced-diameter portion at one end, seated behind said head, and an increased-diameter portion at the other end;
   a tubular steel push piece, slidable within said holder, having a conical external surface at one end fitting within said cone surface, an axial bore aligned with said tube bore, and an internal cone surface at the other end merging with said axial bore;
   a capillary steel tubing having an external conical end fitting within the last-named internal cone surface, and a radial flange; and
   a gland, threaded in said increased-diameter portion of said holder and engaging said flange, for maintaining said cone-shaped and conical surfaces in fluid-tight relationship.

* * * * *